United States Patent
Nogi et al.

(10) Patent No.: US 9,343,340 B2
(45) Date of Patent: May 17, 2016

(54) VACUUM PROCESSING APPARATUS

(75) Inventors: Keita Nogi, Tokyo (JP); Hideaki Kondo, Kudamatsu (JP); Susumu Tauchi, Shunan (JP); Teruo Nakata, Yokohama (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 148 days.

(21) Appl. No.: 13/021,827

(22) Filed: Feb. 7, 2011

(65) Prior Publication Data

US 2011/0229289 A1 Sep. 22, 2011

(30) Foreign Application Priority Data

Mar. 16, 2010 (JP) ................. 2010-059645

(51) Int. Cl.
*H01L 21/677* (2006.01)
*H01L 21/67* (2006.01)

(52) U.S. Cl.
CPC .... *H01L 21/67201* (2013.01); *H01L 21/67745* (2013.01)

(58) Field of Classification Search
CPC .............. H01L 21/67745; H01L 21/67748
USPC .................................. 414/217, 939
See application file for complete search history.

(56) References Cited

U.S. PATENT DOCUMENTS

| | | | | |
|---|---|---|---|---|
| 5,695,564 A | * | 12/1997 | Imahashi | 118/719 |
| 5,855,681 A | * | 1/1999 | Maydan et al. | 118/719 |
| 5,882,165 A | * | 3/1999 | Maydan et al. | 414/217 |
| 6,729,824 B2 | * | 5/2004 | Lei et al. | 414/217 |
| 6,759,336 B1 | * | 7/2004 | Chebi et al. | 438/694 |
| 7,699,574 B2 | * | 4/2010 | Ferrara | 414/217 |
| 2005/0005849 A1 | | 1/2005 | Noboru | |
| 2006/0182539 A1 | * | 8/2006 | Ozawa et al. | 414/217 |
| 2006/0263177 A1 | | 11/2006 | Meulen | |
| 2007/0217896 A1 | * | 9/2007 | Kim et al. | 414/217 |
| 2008/0232933 A1 | * | 9/2008 | Kiley | B65G 25/02 414/217 |

FOREIGN PATENT DOCUMENTS

| | | |
|---|---|---|
| JP | 05-160241 | 6/1993 |
| JP | 2004-349503 | 12/2004 |
| JP | 2007-511104 | 4/2007 |
| JP | 2009-094530 | 4/2009 |

\* cited by examiner

*Primary Examiner* — Jonathan Snelting
(74) *Attorney, Agent, or Firm* — Baker Botts L.L.P.

(57) ABSTRACT

A vacuum processing apparatus is disclosed for processing workpieces. The apparatus includes a load lock adapted to store the workpiece inside and to be switched between atmosphere and vacuum. Vacuum transport chambers are connected to the load lock and to the corresponding process chambers in a state where the load lock and each of the process chambers are isolated. The workpiece can be transferred between each of the process chambers and the load lock via the corresponding vacuum transport chamber. The apparatus also includes load lock valves for switching between interrupt and opening between the load lock and the corresponding vacuum transport chambers, and process chamber valves for switching between interrupt and opening between the process chambers and the corresponding vacuum transport chambers. Timing for opening and closing the valves is controlled in synchronization with the transfer of the workpieces.

6 Claims, 16 Drawing Sheets

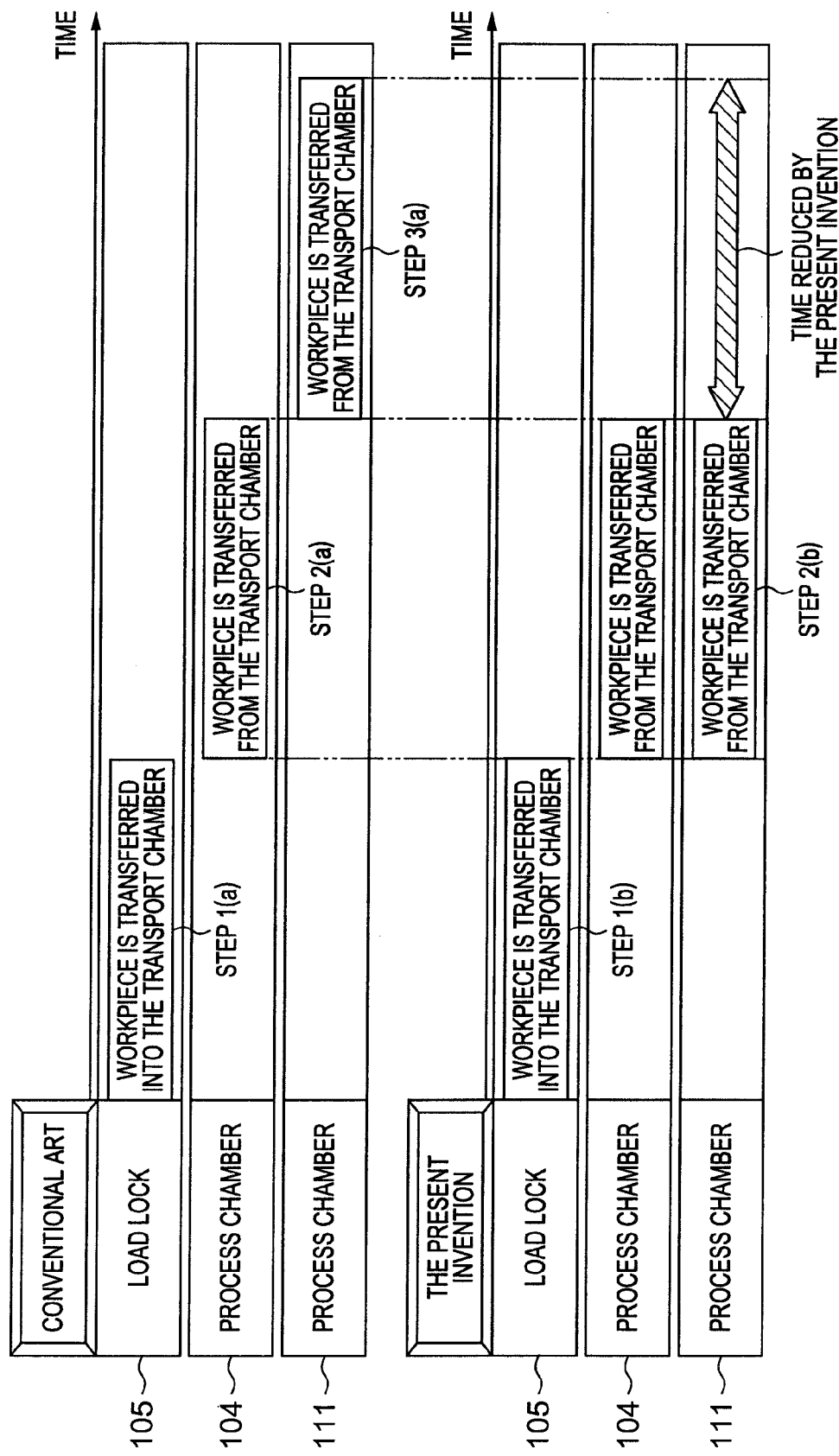

PRIOR ART  FIG. 4A
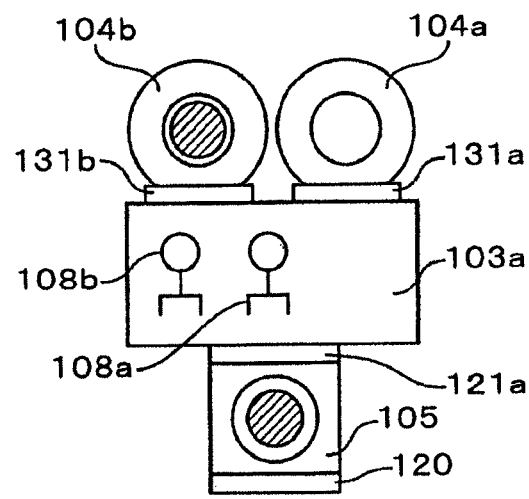
PRIOR ART  FIG. 4B
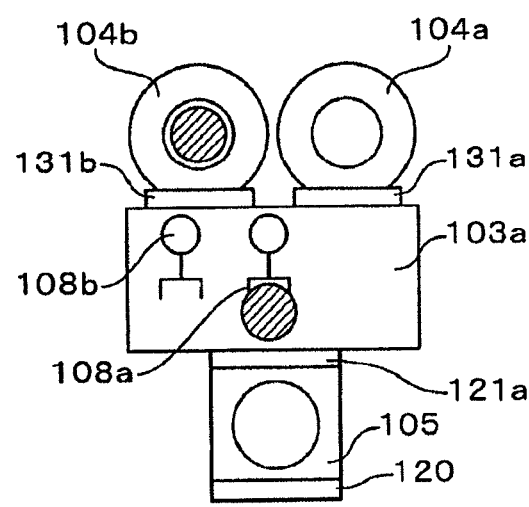

PRIOR ART  FIG. 4C
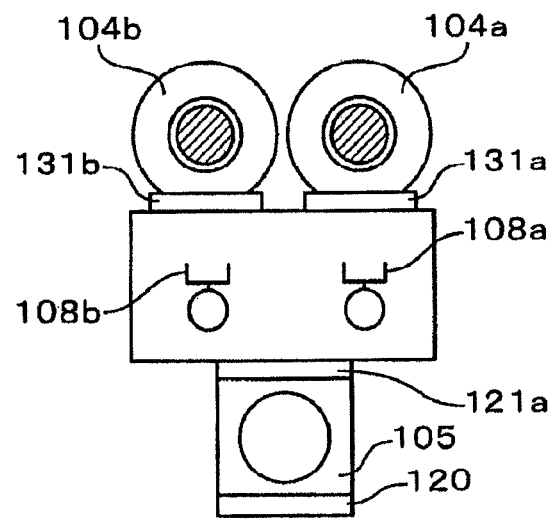
PRIOR ART  FIG. 4D
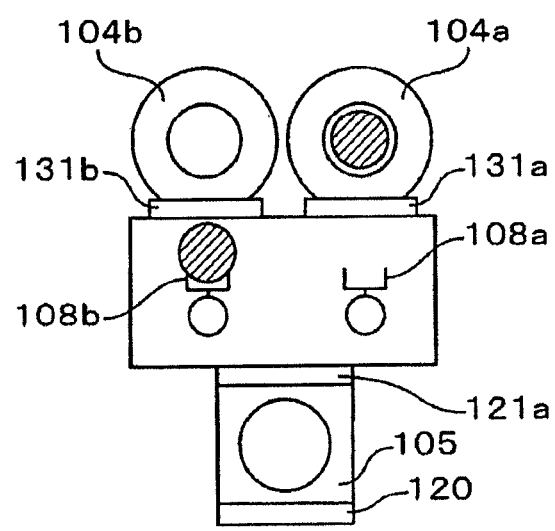

VACUUM PROCESSING APPARATUS

CLAIM OF PRIORITY

The present application claims priority from Japanese patent application JP 2010-059645 filed on Mar. 16, 2010, the content of which is hereby incorporated by reference into this application.

BACKGROUND OF THE INVENTION

1. Field of the Invention

The present invention relates to a vacuum processing apparatus used for processing a board-like workpiece such as a semiconductor wafer or a liquid crystal display to perform processing such as fine patterning or the like by use of a plurality of gases.

2. Description of the Related Art

A vacuum processing apparatus is provided with a processing unit including a vacuum vessel internally having a process chamber called a process unit, an exhaust device, a plasma forming device and the like. Such a vacuum, processing apparatus requires low costs and improved productivity. In particular, the vacuum processing apparatus has a major problem in that throughput (the number of boards processed per unit hour) is improved to increase efficiency of processing per apparatus. In the following, a semiconductor processing apparatus is partially described as an example; however, the present invention is not limited to the semiconductor processing apparatus. The processing performed by the semiconductor processing apparatus, one of the vacuum processing apparatuses, includes a step of subjecting a workpiece such as a semiconductor wafer which is a board to be processed, to processing under vacuum, e.g., plasma processing such as etching or the like. In order to perform such processing with high throughput, i.e., to increase efficiency of processing per apparatus, a semiconductor processing apparatus provided with a plurality of process chambers is used. Semiconductor processing apparatuses are generally known that include a process chamber and an atmospheric transport chamber under ordinary pressure.

A cassette storing the predetermined number of, e.g. 25, wafers is mounted on the front side of the semiconductor processing apparatus as described above. A transfer robot takes the wafers one by one out of the cassette and transfers those to a load lock that is adopted to be switched between atmosphere and vacuum. Thereafter, the wafer is transferred from the load lock depressurized through vacuum evacuation via a depressurized transfer path into any one of process chambers in which the wafer is processed. After the processing, the wafer is transferred from such a process chamber, passing through the path in a direction reverse to that during the loading, via the load lock to under the atmospheric pressure. Thereafter, the wafer is returned to the same position in the same cassette from which it was transferred by the transfer robot. This is the general order of the actions in processing the wafer in the semiconductor processing apparatus.

In order to improve throughput in a series of actions in the semiconductor processing apparatus, it is conceivable to improve a transfer rate of a workpiece or to reduce processing time. In recent years, the processing time has been reduced; therefore, the semiconductor processing apparatus requires an improvement in transfer rate.

JP-A-2009-94530 (patent document 1) discloses a mechanism in which a transfer robot can concurrently transfer workpieces to a plurality of corresponding process chambers by extension and retraction of two arms thereof, and a method of achieving high-throughput by use of the mechanism. However, processing gases may be different in type from each other. In such a case, it is necessary to transfer the workpieces in such a manner as to prevent gases from mixing with each other, in order to prevent processing accuracy from being degraded and a workpiece from being contaminated.

To meet the necessity, patent document 1 discloses the method of preventing the gases from mixing with each other by increasing the pressure outside the process chamber to reduce an amount of contaminated matter containing the processing gases that is discharged outwardly from the process chamber.

SUMMARY OF THE INVENTION

In order to improve the throughput of the vacuum processing apparatus in which a plurality of process chambers are installed, it is necessary to concurrently transfer workpieces to the process chambers without mixing of the gases in the process chambers.

To meet the necessity, in patent document 1, the workpieces are concurrently transferred to the plurality of process chambers without mixing of the gases by adjusting pressure without sequentially switching between the opening and closing of the valves of the process chambers for the transfer of the workpieces. However, it is difficult to completely prevent the mixing of gases. There is a moment when the process chambers have a pressure difference but share a space not isolated by a valve. Thus, gases may mix with each other in some cases.

Accordingly, it is an object of the present invention to provide a semiconductor processing apparatus as follows. In the semiconductor processing apparatus having a plurality of conventional process chambers, concurrently transfer of workpieces to the process chambers without mixing of gases is realized while wafer processing capacity of the semiconductor processing apparatus is not impaired.

(1) According to the present invention, there is provided a vacuum processing apparatus provided with a plurality of process chambers for processing workpieces, the apparatus including: a load lock having means for storing the workpiece in the inside thereof and switching the inside between atmosphere and vacuum; vacuum transport chambers connected to the load lock and to the corresponding process chambers in a state where the load lock and each of the process chambers are isolated from each other; transfer means, installed in each of the vacuum transport chambers, for transferring the workpiece between the vacuum transport chamber and the load lock or between the vacuum transport chamber and the corresponding process chamber; load lock valves for controlling the loading and unloading of the workpieces through opening and closing actions at connecting portions between the load lock and the corresponding vacuum transport chambers; process chamber valves for controlling the loading and unloading of the workpieces through opening and closing actions at connecting portions between the process chambers and the corresponding vacuum transport chambers; and control means for controlling timing of the opening and closing actions of the load lock valves and of the process chamber valves; wherein, in a state where all the load lock valves are closed, the control means allows each of the process chamber valves to perform opening and closing actions regardless of a state where a plurality of the process chamber valves at the corresponding connecting portions with the associated vacuum transport chambers are each opened or closed.

(2) Preferably, in the vacuum processing apparatus described in the above item (1), the load lock includes holding means capable of holding a plurality of workpieces, and the plurality of workpieces held by the holding means are each transferred from the load lock via the vacuum transport chamber to each of the process chambers in a period of time where the load lock is maintained in a vacuum state.

(3) Preferably, in the vacuum processing apparatus described in the above item (2), the load lock is provided with holding means capable of aligning the plurality of workpieces in a direction perpendicular to an installation plane on which the load lock is installed.

(4) Preferably, the vacuum processing apparatus described in any one of the above items (1), (2) and (3), includes a plurality of first valves connected to a plurality of corresponding vacuum transport chambers disposed on the same installation plane; a second valve connected to the load lock disposed in a position having a height different from that of the installation plane; and conveying means for conveying the workpiece carried in from the second valve to the first valve.

Because of employing the configuration described in the above item (1), the process chambers will not share the vacuum transport chamber. In the state of blocking between the load lock and each of the vacuum transport chambers, the valve of one of the process chambers may be opened. Also in such a state, the gas used in this process chamber will not enter another process chamber even if the valve thereof is opened in view of configuration. Thus, regardless of the opening and closing state of the valve of one of the process chambers, it is possible to open and close the valve of another process chamber independently.

It is not necessary to transfer the workpieces by adjusting pressure instead of transferring the workpieces by sequentially switching between the opening and closing of the valves of the process chambers, in order to concurrently the transfer workpieces to the process chambers without mixing of the gases of the process chambers.

Thanks to these features, the opening and closing of the valve of one of the process chambers can be controlled without being influenced by the opening and closing timing of the valve of another process chamber, i.e., without a provision of waiting time for waiting the opening of the valve of one of the process chambers until the valve of another process chamber will be closed. Thus, the throughput of the entire system can be improved.

The configuration of the vacuum processing apparatus according to the present invention can concurrently transfer wafers to the plurality of process chambers without mixing of the gases used in the process chambers, thereby allowing for an improvement in throughput.

BRIEF DESCRIPTION OF THE DRAWINGS

FIG. 2 illustrates a Gantt chart for an action of transferring a workpiece in a conventional apparatus and a Gantt chart for an action of transferring a workpiece in the apparatus of the present invention.

FIG. 4A illustrates an action of the conventional apparatus in FIG. 2.

FIG. 4B illustrates the action of the conventional apparatus in FIG. 2.

FIG. 4C illustrates the action of the conventional apparatus in FIG. 2.

FIG. 4D illustrates the action of the conventional apparatus in FIG. 2.

DETAILED DESCRIPTION OF THE PREFERRED EMBODIMENTS

First Embodiment

A vacuum processing apparatus according to the present invention will hereinafter be described in detail with reference to FIGS. 1 to 5C taking a semiconductor processing apparatus as a first embodiment.

A semiconductor processing apparatus forms a fine pattern on the surface of a workpiece such as a semiconductor wafer in semiconductor manufacturing processes. The workpieces such as semiconductor wafers are stored in a cassette and is transferred to the semiconductor processing apparatus. Thereafter, the workpiece is transferred by a transfer robot from the cassette in the atmospheric state via a load lock adopted to be switched between atmosphere and vacuum, to a process chamber maintained in a vacuum state. After the workpiece has been subjected to pattern forming processing, it is returned to the cassette again. As described above, the semiconductor processing apparatus is composed of an atmospheric area, a vacuum area, and chambers adapted to be switched between atmosphere and vacuum.

Figure 1:
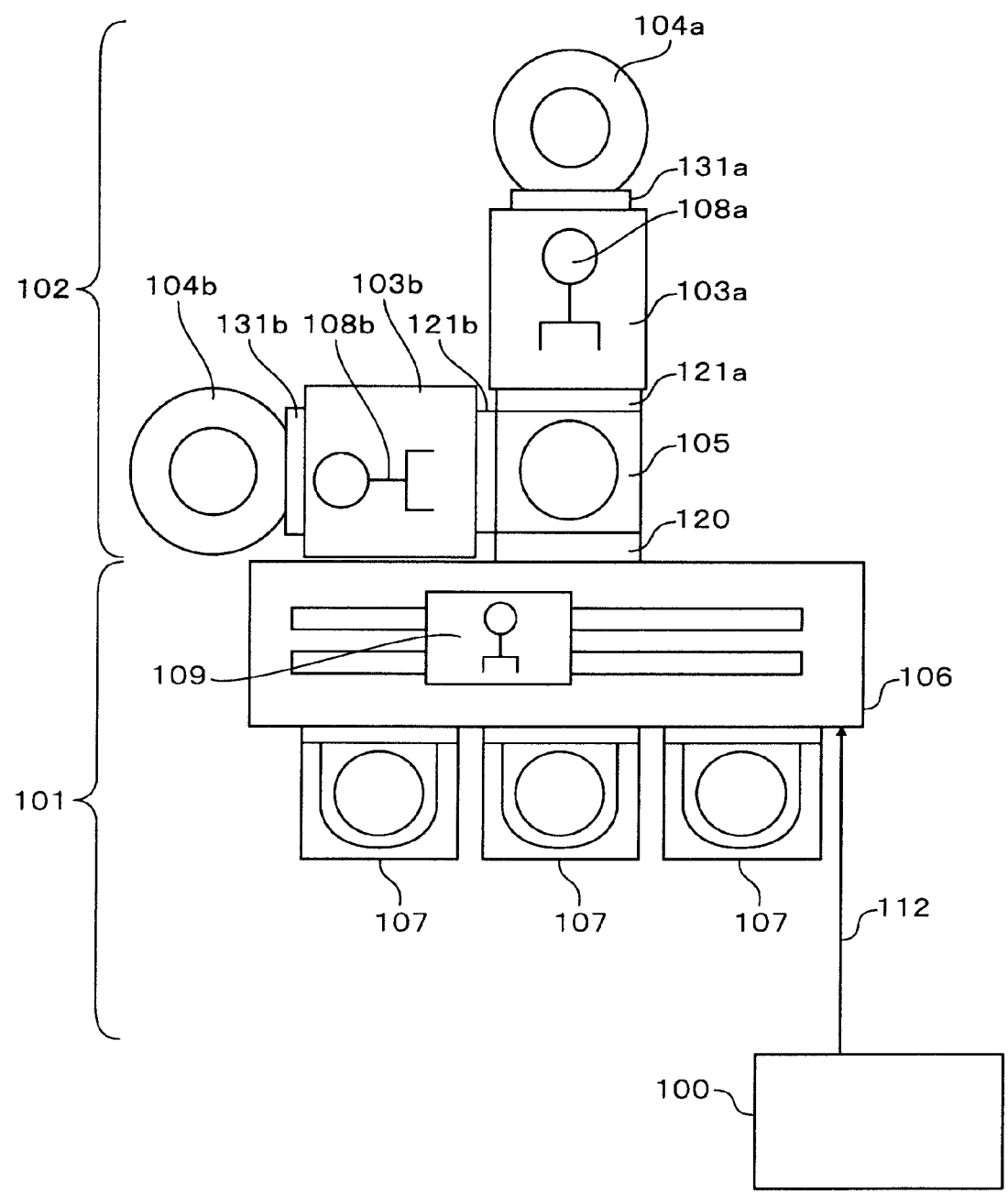
FIG. 1 illustrates a configuration of an apparatus according to the present invention.

FIG. 1 illustrates a configuration of a semiconductor processing apparatus according to an embodiment of the present invention. A control section 100 controls the action of the entire apparatus based on signals transmitted and received via a signal line 112. An atmospheric side block 101 transfers, stores and positions a workpiece to be processed such as a wafer under atmospheric pressure.

A vacuum side block 102 is a block that transfers board-like workpieces such as wafers under pressure reduced from the atmospheric pressure and processes them in predetermined process chambers. A load lock 105 connects the atmospheric block 101 with the vacuum block 102.

A description is first given of the constituent elements of the atmospheric block 101. A plurality of cassette tables 107 are installed in the atmospheric block 101. Cassettes in which workpieces to be processed or cleaned are stored are put on the corresponding cassette tables 107. A housing 106 is connected to the cassette tables 107 and provided with a mechanism for transferring the workpieces stored in the cassettes to the inside of the apparatus and a mechanism for positioning the workpieces. An atmospheric transfer robot 109 is installed inside the housing 106 for performing taking out and putting in of a workpiece between the cassette put on the cassette table 107 and the housing 106 by extending and retracting an arm on which the workpiece is put to be hold.

The atmospheric side valve 120 is connected to the load lock 105 and has a role of blocking the flow of air between the housing 106 and the load lock 105 by being closed.

A description is next given of constituent elements of the vacuum block 102. One or a plurality of the load locks 105 are installed between the atmospheric side block 101 and the vacuum side block 102, and adopted to be switched between the atmosphere and vacuum in the state where the workpieces are stored therein. A vacuum side valve 121a is connected to the load lock 105 and has a role of keeping the load lock air-tight by being closed along with the atmospheric side valve 120. Also a vacuum side valve 121b has the same role.

A vacuum transport chamber 103a is internally provided with a mechanism for transferring a workpiece. The vacuum transport chamber 103a shares a space along with the load lock 105 via the vacuum side valve 121a. When the inside of the load lock is at the atmospheric pressure, the vacuum side valve 121a is closed. When the inside of the load lock is depressurized, the inside of the vacuum transport chamber is constantly kept in the vacuum state by controlling the vacuum valve 121a so as to be opened. Also the vacuum transport chamber 103b is constantly kept in the vacuum state by opening and closing the vacuum side valve 121b. A vacuum transfer robot 108a is installed at a center of the vacuum transport chamber 103a and transfers a workpiece between the load lock 105 and the vacuum transport chamber 103a, under vacuum, by extending and retracting an arm on which the workpiece is put to be hold.

A process chamber valve 131a is connected to the vacuum transport chamber 103a and has a role of maintaining the air tight of the vacuum transport chamber 103a by being closed along with the vacuum side valve 121a. Also a process chamber valve 131b has the same mechanism and has a role of maintaining the air tight of the vacuum transport chamber 103b by being closed along with the vacuum side valve 121b.

A process chamber 104a is internally provided with a workpiece table used to process a workpiece put thereon. The workpiece is put on the workpiece table and processed by filling up the inside of the process chamber with processing gas. The process chamber 104a shares a space along with the vacuum transport chamber 103a via the process chamber valve 131a. The inside of the process chamber 104a is kept air-tight by closing the process chamber valve 131a. A taking out and putting in of the workpiece is performed between the process chamber 104a and the vacuum transport chamber 103a by extending and retracting the arm of the vacuum transfer robot 108a installed in the vacuum transport chamber 103a. Also a process chamber 104b has the same mechanism, processes a workpiece put on the workpiece table therein, and is kept more air-tight by closing the process chamber valve 131b. In addition, a vacuum transfer robot 108b performs taking out and putting in of the workpiece between the vacuum transport chamber 103b and the process chamber 104b. In FIG. 1, the number of the vacuum transport chambers connected to the load lock 105 is two. However, the apparatus can be configured such that the load lock 105 is connected to one or three vacuum transport chambers. If the vacuum transport chamber is connected to a valve connected to the load lock, also its position can be changed freely. If the shape of the load lock is changed, four or more vacuum transport chambers can be connected to such a load lock. As for the process chamber, in FIG. 1, although the number of the process chamber connected to the vacuum transport chamber is one, a plurality of the process chambers may be connected to the vacuum transport chamber.

A description is next given of a transfer process during the processing of workpieces similarly referring to FIG. 1. A cassette in which workpieces are stored is put on any one of the cassette tables 107 of the semiconductor processing apparatus. The atmospheric transfer robot 109 takes out a specified workpiece stored in the cassette put on the cassette table 107 and puts it in the housing 106 side by extending and retracting the arm to put the workpiece on the arm.

The action of the atmospheric transfer robot 109 is here described with reference to FIGS. 3A to 3F. FIGS. 3A to 3F illustrate the action of removing a workpiece from a carrying-out place 110 in which a workpiece is previously stored and placing it in a predetermined carrying-in place 111 by extension and retraction of an arm. A valve 123 is provided between carrying-out place 110 and the transfer robot 122, as well as between carrying-in place 110 and the transfer robot 122.

The transfer robot 122 is provided with an arm used to transfer a workpiece. The number of the arms is one in the present embodiment; however, it may be two or more. Alternatively, the housing and the vacuum transport chamber may be provided with a plurality of the transfer robots. Each of arms has such an individually operable configuration as to be extended and retracted in a direction of turning around an axis of an arm root side end portion, in a vertical direction and in a horizontal direction.

Figure 3A:
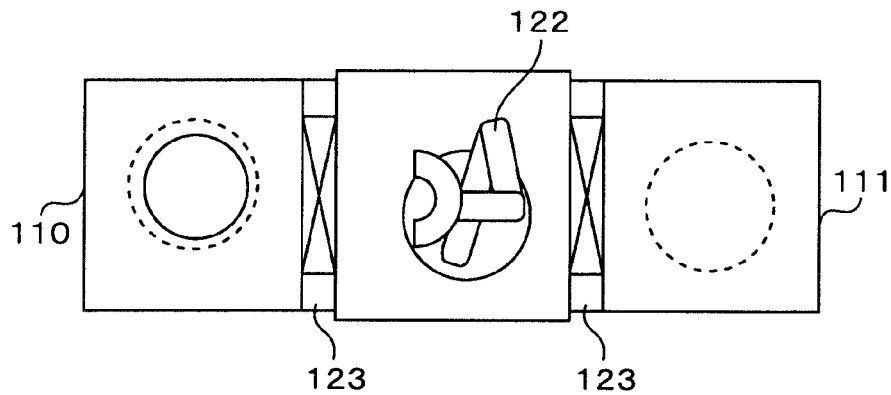
FIG. 3A illustrates a basic action of a transfer means installed in a transport chamber.
Figure 3B:
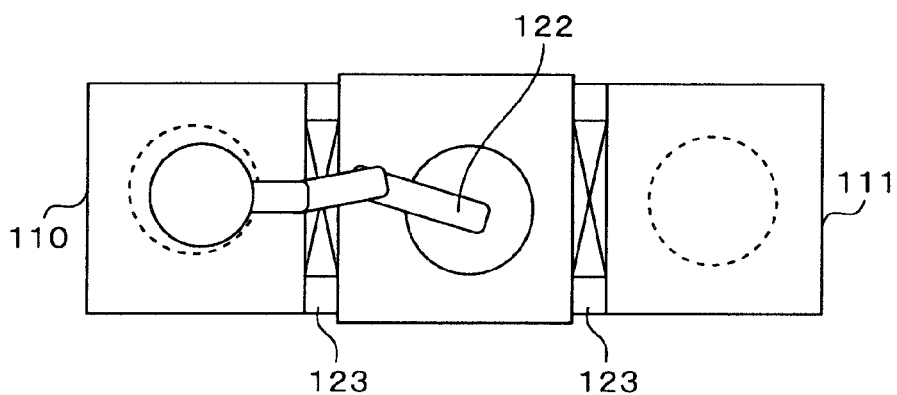
FIG. 3B illustrates the basic action of the transfer means installed in the transport chamber.
Figure 3C:
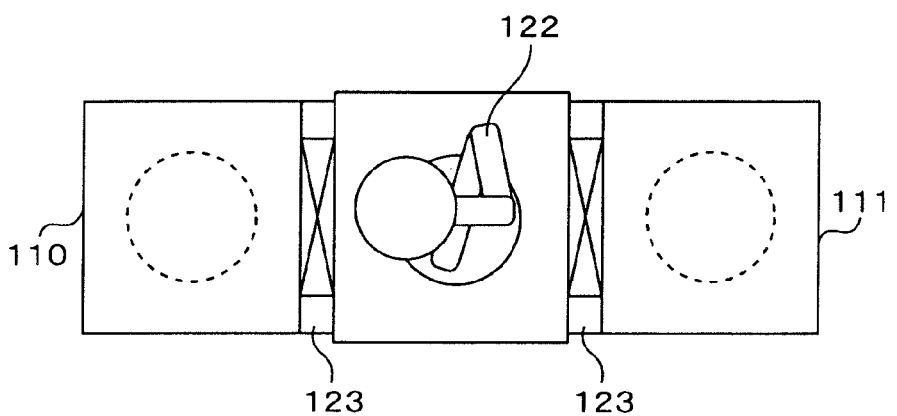
FIG. 3C illustrates the basic action of the transfer means installed in the transport chamber.
Figure 3D:
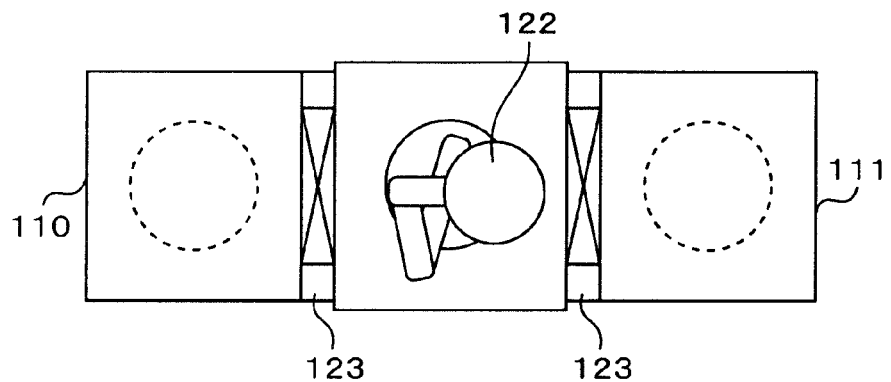
FIG. 3D illustrates the basic action of the transfer means installed in the transport chamber.
Figure 3E:
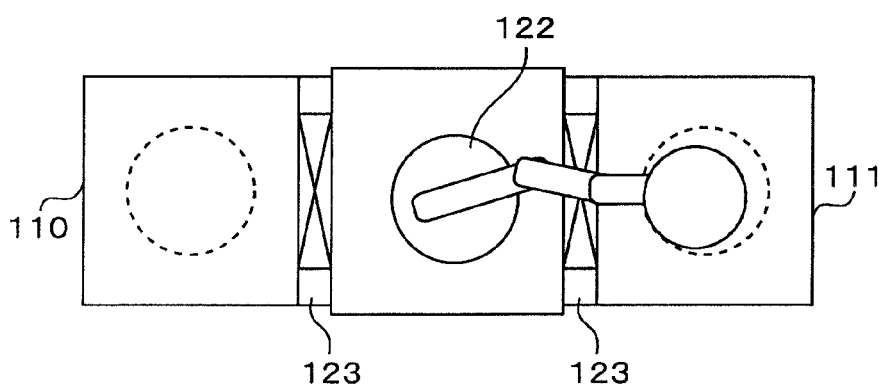
FIG. 3E illustrates the basic action of the transfer means installed in the transport chamber.
Figure 3F:
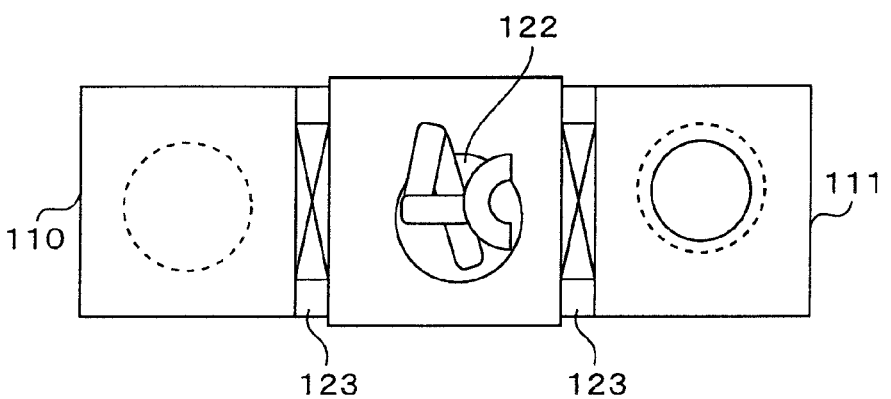
FIG. 3F illustrates the basic action of the transfer means installed in the transport chamber.

The arm of the transfer robot 122 is extended from the state of FIG. 3A toward under the workpiece, as a target to be taken out, stored in the carrying-out place 110 as in FIG. 3B. The transfer robot is shifted upward to put the workpiece on the arm. Thereafter, the arm on which the workpiece is put is retracted as in FIG. 3C to take out the workpiece. Next, the transfer robot is changed in facing direction as in FIG. 3D so that the arm of the transfer robot can be extended inside the carrying-in place 111. The workpiece put on the arm is transferred into the inside of the predetermined carrying-in place 111 by extending the arm as in FIG. 3E. Thereafter, the arm is retracted as in FIG. 3F. In the previous description with FIG. 1, the transfer robot 122 corresponds to the atmospheric transfer robot 109, the carrying-out place 110 corresponds to the cassette and the carrying-in place 111 corresponds to the load lock 105.

Returning to the description with FIG. 1, after the workpiece is taken out by the atmospheric transfer robot 109, the atmospheric side valve 120 is opened. In addition, the workpiece held on the arm is stored inside the load lock 105 by extending and retracting the arm of the atmospheric transfer robot 109. After the atmospheric side valve 120 has been closed to make the load lock air-tight, the inside of the load lock 105 is depressurized from the atmospheric pressure to a predetermined pressure. The vacuum side valve 121a is opened and the arm of the vacuum transfer robot 108a installed in the vacuum transport chamber 103a is extended and retracted to put the workpiece on the arm to be held. In this way, the workpiece stored in the load lock 105 is taken out and placed on the vacuum transport chamber 103a side.

Although there is a difference between under vacuum and under atmospheric pressure, the vacuum transfer robot performs the same actions as the atmospheric transfer robot as in FIGS. 3A to 3f. Incidentally, the transfer robot 122 corresponds to the vacuum transfer robot 108a, the carrying-out place 110 corresponds to the load lock 105 and the carrying-in place 111 corresponds to the Process chamber 104a. After the workpiece has been taken out by the vacuum transfer robot 108a, the air tight of the vacuum transport chamber is maintained by closing the vacuum side valve.

Next, after the vacuum side valve 121a has fully been closed, the process chamber valve 131a connected to the vacuum transport chamber 103a is opened. In this case, if the process chamber valve 131a is opened before the vacuum side valve 121a is fully closed, there is a possibility that residual gas in the process chamber enters inside the load lock to contaminate the workpiece. Therefore, after the vacuum side valve 121a is closed without fail, the process chamber valve 131a is opened. The vacuum transfer robot 108a extends and retracts the arm with the workpiece put on the arm to load the workpiece into the predetermined process chamber 104a. After the workpiece is transferred in the process chamber 104a, the process chamber valve 131a is closed to seal the process chamber 104a. Thereafter, processing gas is led into the process chamber 104a, a vacuum is produced in the process chamber and the workpiece is processed.

After the processing of the workpiece is finished, the process chamber valve 131a opening and closing between the process chamber 104a and the vacuum transport chamber 103a described above is opened. The vacuum transfer robot 108a takes the processed workpiece out of the process chamber 104a and places it on the vacuum transport chamber 103a side reversely to the case where the workpiece is transferred into the process chamber, by extending and retracting the arm to put the workpiece thereon. Thereafter, the process chamber valve 131a connected to the vacuum transport chamber 103a is closed to seal the vacuum transport chamber 103a. After the process chamber valve 131a is closed, the vacuum side valve 121a is opened. Also in this case, to prevent gas from entering the load lock, after the process chamber valve is closed without fail, the vacuum side valve is opened. The vacuum transfer robot 108a transfers the held processed workpiece from the vacuum transport chamber 103a into the load lock 105 while extending and retracting the arm. In FIGS. 3A-3F, the transfer robot 122 corresponds to the vacuum transfer robot 108a, the carrying-out place 110 corresponds to the process chamber 104a and the carrying-in place 111 corresponds to the load lock 105. After the processed workpiece is stored in the load lock 105, the vacuum side valve 121a connecting the load lock 105 with the vacuum transport chamber 103a is closed to seal the load lock 105. Thereafter, the pressure in the load lock is raised to the atmospheric pressure.

After the pressure inside the load lock has reached the atmospheric pressure, the atmospheric side valve 120 connected to the load lock 105 and to the housing 106 is opened. The atmospheric side transfer robot 109 takes the workpiece out of the load lock 105 and transfers it to the original cassette to return it to the original position, by extending and retracting the arm for putting the workpiece thereon.

The above is a series of the actions of transferring the workpiece from the cassette via the load lock 105 and the vacuum transport chamber 103a to the process chamber 104a and returning it to the original cassette after the processing. The same actions are performed on the case where the workpiece is transferred from the cassette via the load lock 105 and the vacuum transport chamber 103b to the process chamber 104b for processing.

The usefulness of the present invention is described by use of FIG. 2, comparing the transfer actions between the conventional apparatus and the apparatus of the present invention. FIG. 2 includes Gantt charts illustrating comparison in the vacuum block between the actions of the conventional apparatus and those of the apparatus of the present invention. A Gantt chart is a diagram in which the constituent elements of the apparatus are allocated in the vertical direction, time is allocated on the horizontal axis, and times required for the respective actions of the constituent elements are denoted with horizontal bars having respective lengths proportional to the corresponding times. In FIG. 2, the load lock and the process chambers are allocated in the vertical direction and times required for the respective transfer actions in the corresponding chambers are shown. In this way, a comparison in the time required for transfer action is made between the conventional apparatus and the apparatus of the present invention.

Figure 6:
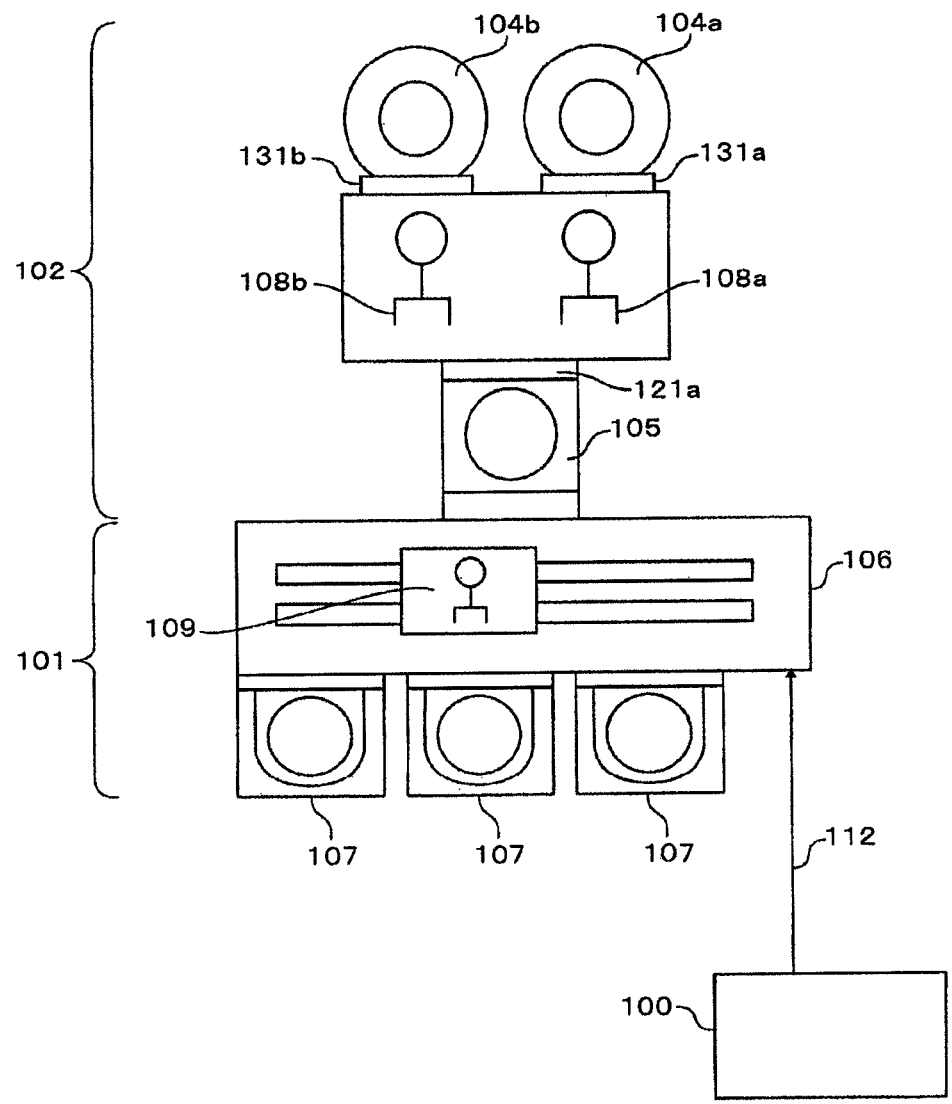
FIG. 6 illustrates the configuration of the conventional apparatus.

The configuration of the conventional apparatus is first described with reference to FIG. 6. Similarly to the apparatus of the present invention, the conventional apparatus includes an atmospheric block 101, a load lock 105 adapted to be switched between the atmosphere and vacuum, and a vacuum block 102. A workpiece is also transferred by the same transfer actions to a process chamber 104a and the processed workpiece is returned to a cassette.

To compare the convention apparatus with the apparatus of the present invention under the same conditions, the configuration of the conventional apparatus is such that for example the number of process chambers is two and the number of the vacuum transfer robots is two. A difference between the configuration of the conventional apparatus and the apparatus of the present invention is as below. In the conventional apparatus, a transfer path from the load lock 105 to the process chambers 104a and 104b is a single vacuum transport chamber 103a. On the other hand, in the apparatus of the present invention, the transfer path from the load lock 105 to the process chambers 104a and 104b is divided into the two vacuum transfer paths 103a and 103b.

Figure 5A:
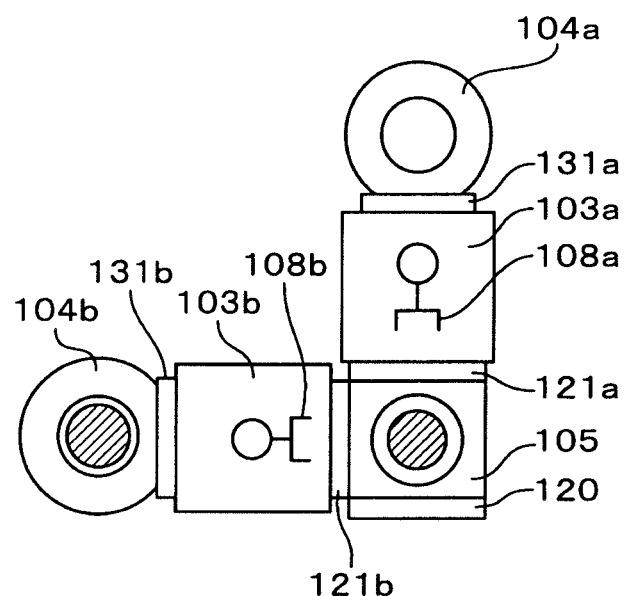
FIG. 5A illustrates an action of the apparatus according to the present invention in FIG. 2.
Figure 5B:
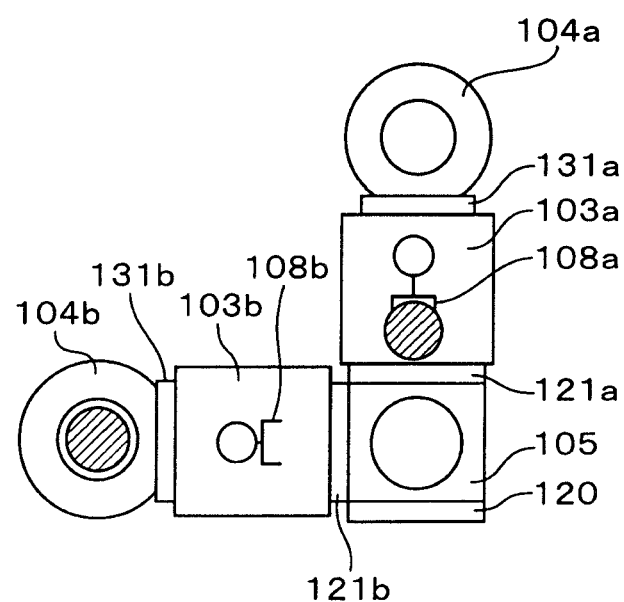
FIG. 5B illustrates the action of the apparatus according to the present invention in FIG. 2.
Figure 5C:
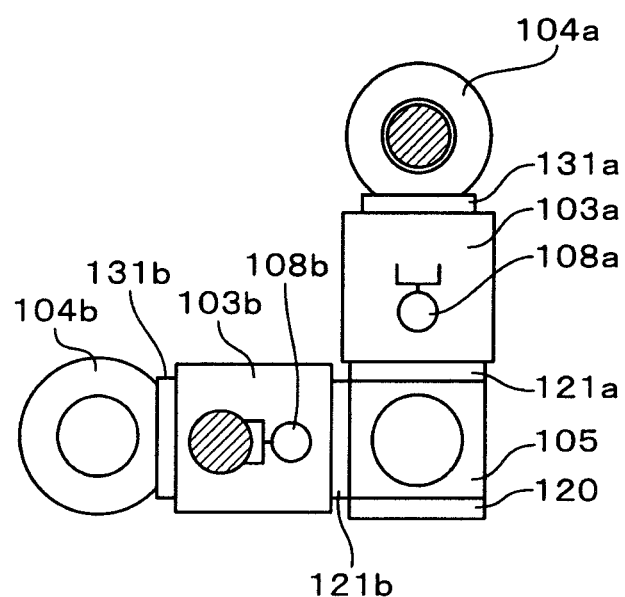
FIG. 5C illustrates the action of the apparatus according to the present invention in FIG. 2.

A difference in the actions of the vacuum block between the conventional apparatus and the apparatus of the present invention is described by use of the Gantt charts in FIG. 2 and with reference to FIGS. 4A to 4D and 5A to 5C. FIG. 4A to 4D illustrate the order of the actions for transferring the workpiece in the conventional apparatus. FIGS. 5A to 5C illustrate the order of the actions for transferring the workpiece in the apparatus of the present invention.

The conventional apparatus on the upper part of the Gantt chart in FIG. 2 is described with reference to FIG. 4A to 4D.
(i) Step 1(a) Illustrated in FIG. 2

As illustrated in FIG. 4A, transfer is started from a state, as an initial state, where an unprocessed workpiece is stored in a load lock 105 and a processed workpiece is stored in the process chamber 104b. A vacuum side valve 121a between the load lock 105 and the vacuum transport chamber 103a is opened and a vacuum robot 108a unloads the workpiece from the load lock and places it on the vacuum transport chamber side by extending its arm. Thereafter, the vacuum side valve 121a is closed to seal the vacuum transport chamber 103a. In this way, the state of FIG. 4B is achieved.

(ii) Step 2(a) Illustrated in FIG. 2

In FIG. 4B, the vacuum side valve 121a is fully closed to prevent the gas in the process chamber from entering the load lock. Thereafter, a valve 131a between the vacuum transport chamber 103a and the process chamber 104a is opened. In this case, it is conceivable that the vacuum transfer robot 108b unloads the processed workpiece from the process chamber 104b. However, the workpiece cannot be transferred from the process chamber 104b because of the following reason. A plurality of the process chambers 104a and 104b are connected to the vacuum transport chamber 103a. In the case where any of the process chamber valves 131a and 131b is opened, if the other process chamber valve is opened, gases in the process chambers will mix each other. This poses a problem of safety.

After the process chamber valve 131a has been opened, the transfer robot 108a loads the workpiece into the process chamber 104a by extending the arm. Thereafter, the process chamber valve 131a is closed to seal the process chamber 104a. These actions achieve the state of FIG. 4C.

(iii) Step 3(a) Illustrated in FIG. 2

To prevent the gases in the process chamber from mixing with each other, after the process chamber valve 131a has fully been closed, the process chamber valve 131b is opened. The vacuum transfer robot 108b unloads the workpiece from the process chamber 104b by extending the arm. Thereafter, the process chamber valve 131b is closed to seal the process chamber 104b. In this way, the state of FIG. 4D is achieved in which the workpiece is transferred in the process chamber 104a and the workpiece is transferred from the process chamber 104b.

The present invention in the lower part of the Gantt chart in FIG. 2 is next described with reference to FIGS. 5A to 5C.

(i) Step 1(b) Illustrated in FIG. 2

As illustrated in FIG. 5A, transfer is started from a state, as an initial state, where an unprocessed workpiece is stored in the load lock 105 and a processed workpiece is stored in the process chamber 104b. Similarly to the conventional apparatus, the vacuum side valve 121a between the vacuum transport chamber 103a and the load lock 105 is opened and the transfer robot 108a unloads the workpiece by elongating the arm. Thereafter, the vacuum side valve 121a is closed to seal the vacuum transport chamber 103a. In this way, the state of FIG. 5B is achieved.

(ii) Step 2(b) Illustrated in FIG. 2.

Referring to FIG. 5B, after the vacuum side valve 121a has been closed, the process chamber valve 131a between the vacuum transport chamber 103a and the process chamber 104a is opened. In addition, the process chamber valve 131b between the vacuum transport chamber 103b and the process chamber 104b is opened. In this case, the reason that the process chamber valve 131b can be opened even though the process chamber valve 131a is opened is as below. Since the vacuum side valve 121a and the vacuum side valve 121b are closed, the respective gases in the process chamber 104a and the process chamber 104b will not mix with each other.

After the process chamber valve 131a has been opened, the vacuum robot 108a loads the workpiece into the process chamber 104a from the vacuum transport chamber 103a by elongating the arm. In addition, the vacuum robot 108b loads the workpiece having been processed in the process chamber 104b, into the vacuum transport chamber 103b by elongating the arm. Thereafter, the process chamber valve 131a and the process chamber valve 131b are closed to seal the vacuum transport chamber 103a and the vacuum transport chamber 103b, respectively. In this way, the state of FIG. 5C is achieved where the workpiece is transferred into the process chamber 104a and the workpiece is transferred from the process chamber 104b.

A major difference between the conventional apparatus and the apparatus of the present invention is whether or not the process chamber valve 131a and the process chamber valve 131b can be opened/closed individually. In the conventional apparatus, if the process chamber valve 131a is opened, the process chamber valve 131b cannot be opened. Therefore, the loading of the workpiece into the process chamber 104a cannot be done concurrently with the unloading of the workpiece from the process chamber 103b in FIG. 6. However, in the present invention, even if the process chamber valve 131a is opened, the process chamber valve 131b can be opened without mixing of the gasses in the process chambers. Therefore, the loading of the workpiece into the process chamber 104a can be done concurrently with the unloading of the workpiece from the process chamber 104b in FIG. 2. Thus, the configuration of the apparatus of the present invention takes a smaller amount of time required to transfer the workpiece than the conventional apparatus, thereby allowing for an improvement in throughput.

A description is next given of a method of concurrently transferring a plurality of workpieces in a configuration adapted to allow the load lock to store the workpieces in the first embodiment described above.

The configuration of the load lock storing the plurality of workpieces and the method of concurrently transferring the workpieces in the semiconductor processing apparatus of the present invention are described in detail with reference to FIGS. 7A, 7B, and 8A-8C.

Figure 7A:
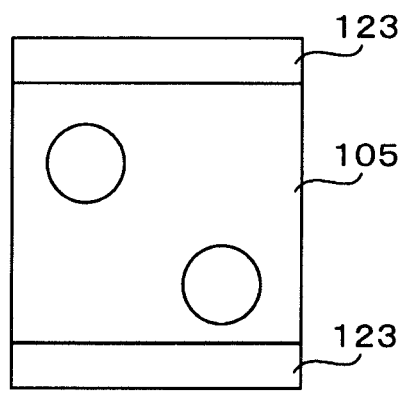
FIG. 7A illustrates a configuration of holding workpieces in a load lock.
Figure 7B:
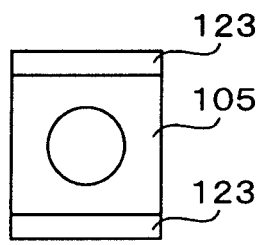
FIG. 7B illustrates a configuration of holding workpieces in the load lock.

Modes of holding the workpieces in the load locks are first described with reference to FIGS. 7A and 7B. FIGS. 7A and 7B illustrates the modes of holding the workpieces in the load locks. The modes of holding the workpieces in the load locks can conceivably include a mode of holding the workpieces aligned in the same plane as the load lock as shown in FIG. 7A and a mode of holding the workpieces aligned in the direction vertical to the plane where the load lock lies as shown in FIG. 7B. In any of these cases, it is possible to concurrently transfer the plurality of workpieces between the load lock and a plurality of vacuum transport chambers connected to the load lock by use of a plurality of transfer robots corresponding to associated valves. However, the mode of aligning the workpieces on the plane as in FIG. 7A has a larger footprint than the mode of aligning the workpieces in the direction vertical to the plane in which the load lock lies as in FIG. 7B. Thus, the mode of holding the workpieces as in FIG. 7B is more advantageous than that as in FIG. 7A in view of space saving. For this reason, the method of concurrently transferring the plurality of workpieces in the mode of aligning the workpieces in the load lock as in FIG. 7B is described with reference to FIG. 8A to 8C.

Figure 8A:
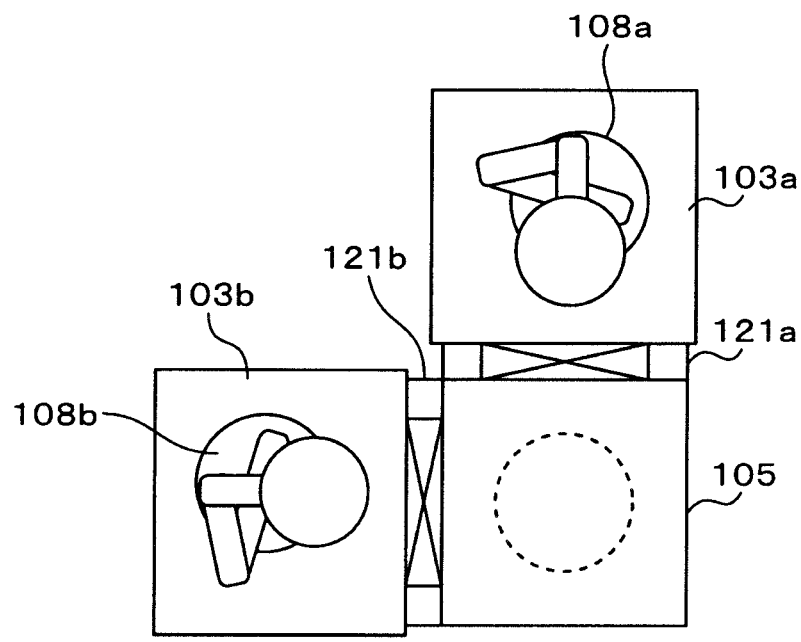
FIG. 8A illustrates arm actions of vacuum transfer robots.
Figure 8B:
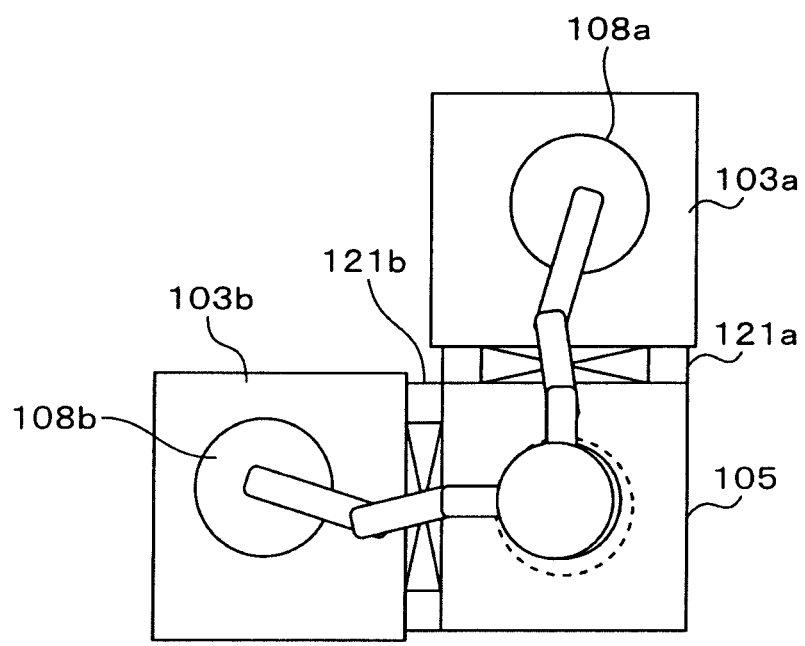
FIG. 8B illustrates the arm actions of the vacuum transfer robots.
Figure 8C:
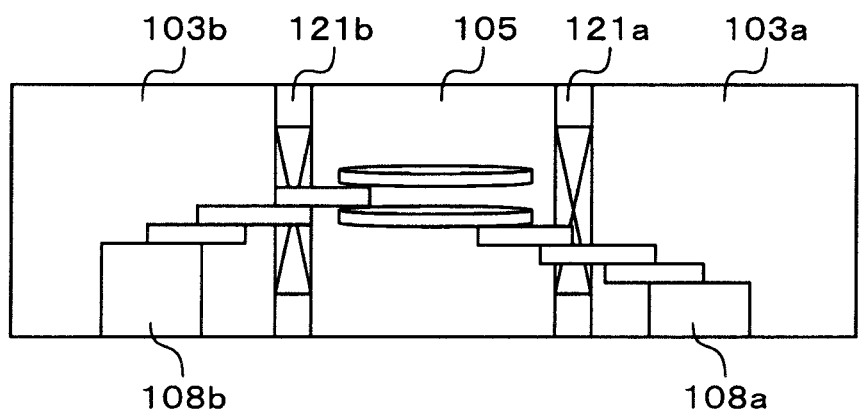
FIG. 8C illustrates the arm actions of the vacuum transfer robots.

FIGS. 8A to 8C illustrate actions in which the vacuum transfer robot 108a elongates the arm to take the workpiece out of the load lock and also another vacuum transfer robot 108b elongates the arm to take the workpiece out of the load lock.

As seen from FIGS. 8A to 8C, the plurality of vacuum transport chambers 103a and 103b are connected to the load lock 105 and the vacuum transfer robots 108a and 108b are respectively installed in the vacuum transport chambers 103a and 103b. In this case, the two vacuum transfer robots, i.e., the vacuum transfer robot 108a and the vacuum transfer robot 108b, can concurrently transfer the corresponding workpieces stored in the load lock. Specifically, while one vacuum transfer robot 108a continues the action of transferring the workpiece from the load lock, the other vacuum transfer robot 108b can start the action of transferring the workpiece from the load lock. More preferably, the control section 100 controls the action of the apparatus so that two vacuum transfer robots 108a and 108b simultaneously may start the transfer of the workpieces. Also in the case where the number of the vacuum transport chambers connected to the load lock is three or more, i.e., the case where the number of the vacuum transfer robots is three or more, similarly the vacuum robots can concurrently transfer the workpieces.

A detailed description is here given of the actions of the two vacuum transfer robots 108a and 108b concurrently transferring the workpieces with reference to FIG. 8C. When transferring the workpiece, the vacuum transfer robot inserts the arm under the workpiece, raises the arm to put the workpiece thereon, and transfers it. In this case, even if the plurality of vacuum transfer robots insert the respective arms into the load lock, they will not come into contact with each other because the arms are vertically offset from each other. In this way, the two vacuum transfer robots 108a and 108b concurrently transfer the workpieces.

In the configuration of the apparatus according to the present invention, a comparison is made between the case where the plurality of vacuum transfer robots sequentially transfer the plurality of workpieces and the case where they concurrently transfer the plurality of workpieces. The concurrent transfer of the workpieces takes a smaller amount of time required for the transfer. Thus, throughput can be improved. As the number of the vacuum transport chambers connected to the load lock is progressively increased, a difference in the amount of time required to transfer the workpieces between the case where the vacuum transfer robots sequentially transfer the workpieces and the case where they concurrently transfer the workpieces. Thus, also a difference in throughput is increased.

A description is next given of a mechanism of holding in the load lock the plurality of workpieces aligned in a direction vertical to the plane in which the load lock lies in the case where the load lock has the plurality of valves and the plurality of workpieces can be held as described above, in the first embodiment.

Figure 9A:
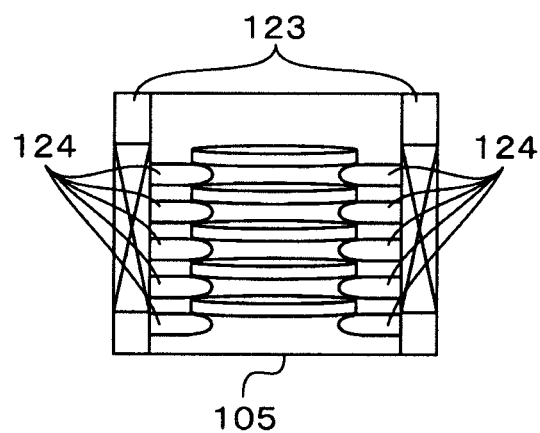
FIG. 9A illustrates a mechanism of a load lock holding a plurality of workpieces.
Figure 9B:
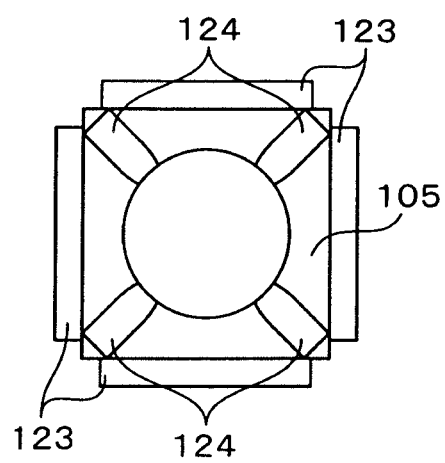
FIG. 9B illustrates the mechanism of the load lock holding the plurality of workpieces.

FIGS. 9A and 9B illustrate the mechanism of the load lock where the plurality of workpieces can be held in the load lock in the form of being aligned in a direction vertical to the plane in which the load lock lies and the vacuum transfer robots can insert their arms into the load lock from a plurality of directions and transfer the workpieces.

Since the conventional load lock is connected to the single vacuum transport chamber, there has been provided a workpiece holding mechanism shaped like a claw or a shelf on its inner wall not provided with the atmospheric side valve or the vacuum side valve. However, when a plurality of vacuum transport chambers are connected to the load lock, such a mechanism cannot be provided. Thus, it is necessary to provide a workpiece holding mechanism in such a manner as not to obstruct the transfer of the workpiece. For example, it can be conceivable that workpiece holding mechanisms 124 each shaped like a claw or a ledge are provided at four corners of the load lock. The provision of such workpiece holding mechanisms can hold a plurality of workpieces in the load lock and insert the arm of the atmospheric transfer robot or of the vacuum transfer robot from any directions of the load lock for transfer of the workpieces.

Second Embodiment

A semiconductor processing apparatus according to a second embodiment is next described in which omnidirectional valves lying in the same plane as a load lock are connected to corresponding vacuum transport chambers. In general, one of the valves connected to the load lock is used as a transfer opening adapted to transfer a workpiece by an atmospheric transfer robot. In order to increase throughput, it is preferable that all the valves connected to the load lock are connected to the corresponding transport chambers.

Figure 10:
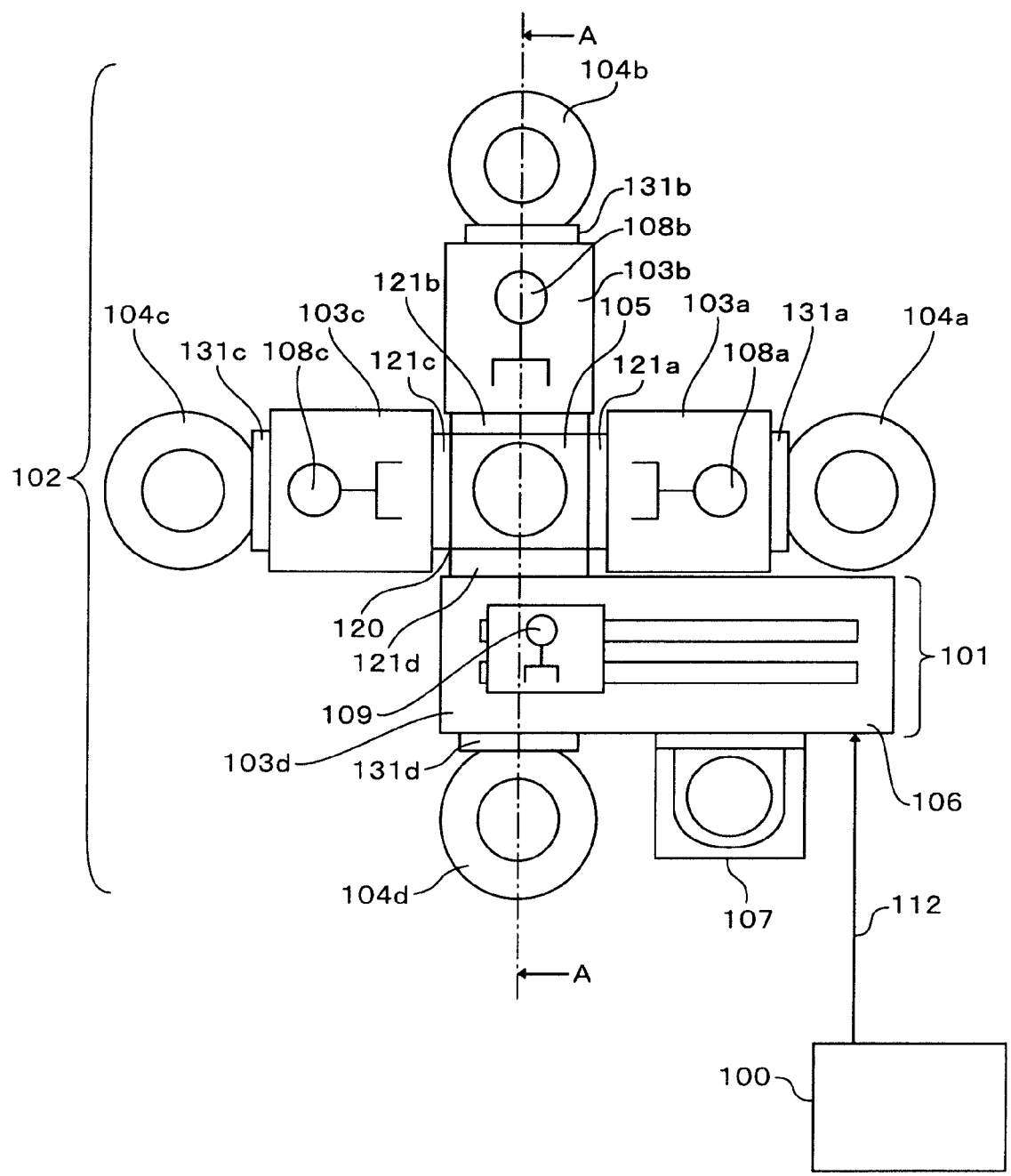
FIG. 10 illustrates an apparatus in which omnidirectional valves lying on the same horizontal plane as the load lock are connected to corresponding vacuum transport chambers.
Figure 11A:
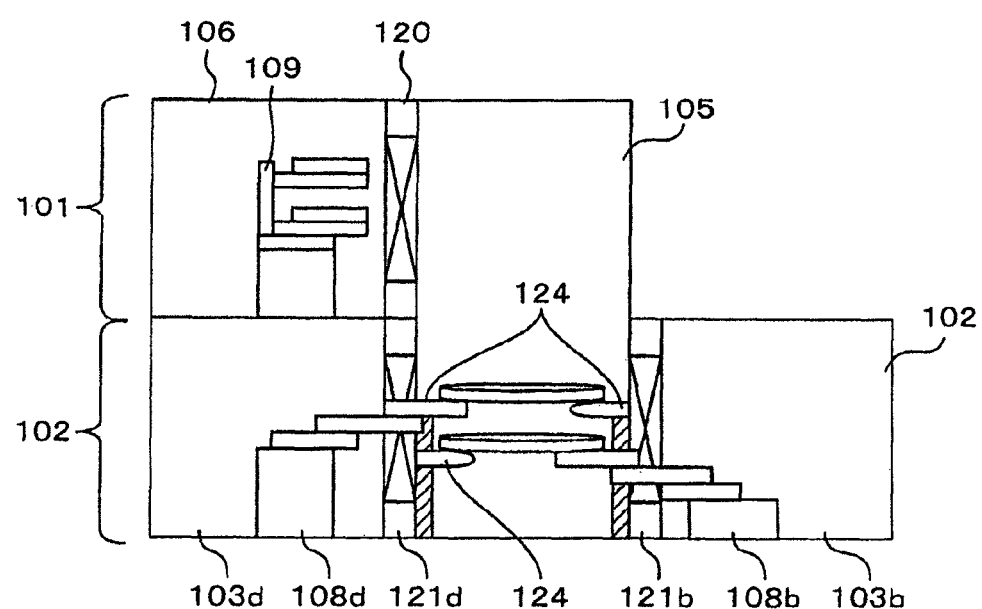
FIG. 11A is a cross-sectional view taken along line A-A in FIG. 10.
Figure 11B:
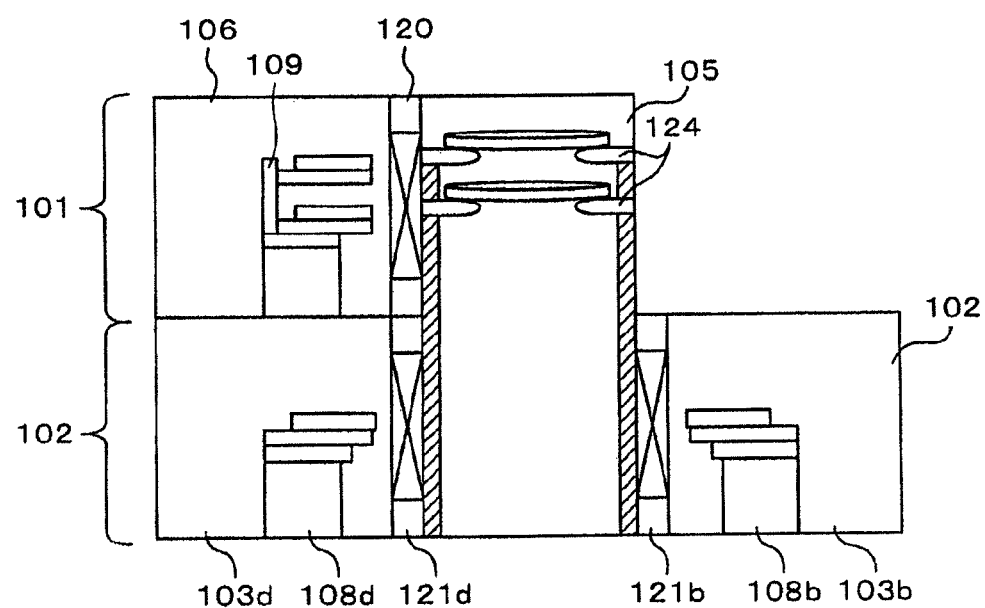
FIG. 11B is a cross-sectional view taken along line A-A in FIG. 10.

The configuration of the semiconductor processing apparatus according to the second embodiment is described with reference to FIGS. 10, 11A and 11B. In this configuration, omnidirectional valves lying in the same plane as the load lock are connected to the corresponding vacuum transport chambers. FIG. 10 illustrates the semiconductor processing apparatus in which the omnidirectional valves lying in the same plane as the load lock are connected to the corresponding vacuum transport chambers. FIG. 11 is a cross-sectional view taken along line A-A in FIG. 10.

Referring to FIG. 10, four vacuum transport chambers 103a, 103b, 103c and 103d are connected to a load lock 105. process chambers 104a, 104b, 104c and 104d are connected to the vacuum transport chambers 103a, 103b, 103c and 103d, respectively. An omnidirectional valve lying in the same plane as the load lock is connected to the vacuum transport chambers. Therefore, it is necessary to transfer the workpiece from above or below the load lock. In FIG. 10, a housing 106 and an atmospheric transfer robot 109 lying in the housing which are constituent elements of the atmospheric transfer block 101 are located above the vacuum transport chamber 103d. A cassette table 107 is connected to the housing 106. In this case, the load lock 105 is connected to the vacuum side valve 121d and to the atmospheric side valve 120 in such a manner that the vacuum side valve 121d and the atmospheric side valve 120 are vertically offset from each other as illustrated in FIGS. 11A and 11B. However, the arrangement of this atmospheric block is one example. Alternatively, a configuration in which also cassettes are stored in the load lock is conceivable. A description is hereinafter given of a transfer process in the second embodiment.

The transfer order of workpieces is as below. Similarly to the semiconductor processing apparatus in FIG. 1, cassettes in which workpieces are stored are put on the cassette table 107. The atmospheric transfer robot 109 takes a workpiece out of the inside of a cassette toward the housing 106 by elongating and contracting the arm thereof. An atmospheric side valve 120 of the load lock 105 is opened. The atmospheric transfer robot stores the workpiece in the load lock by elongating and contracting the arm and the atmospheric side valve is closed. Thereafter, in the load lock, the workpiece is lowered to such a height that the vacuum transfer robot 108a can transfer the workpiece by lowering the workpiece holding mechanism 124 as in FIG. 11A.

The inside of the load lock is depressurized through vacuum evacuation. In the state where the inside of the load lock is depressurized, the vacuum side valve 121a is opened and the vacuum transfer robot 108a takes the workpiece out of the load lock and places it in the vacuum transport chamber by elongating and contracting the arm. In this case, the vacuum transfer robot 108a transfers a plurality of the workpieces by elongating and contracting the arm. After the vacuum side valve 121a has been closed, the process chamber valve 131a is opened and the vacuum transfer robot 108a transfers the workpieces into the process chamber 104a by elongating and contracting the arm. The process chamber valve is closed and the workpieces are processed. After the processing has been finished, the workpieces are transferred to the load lock by the actions reverse to those during the loading. After the transfer, the workpiece holding mechanism 124 is shifted upward as in FIG. 11B, the inside of the load lock is returned to the atmospheric pressure. Then, the atmospheric side valve is opened and the workpieces are returned by the atmospheric side robot to the original position of the original cassette.

The above is the transfer actions of the semiconductor processing apparatus in which the omnidirectional valves lying in the same plane as the load lock are connected to the corresponding vacuum transport chambers.

What is claimed is:

1. A vacuum processing apparatus provided with a plurality of process chambers, each process chamber configured to process a workpiece therein, comprising:
   a load lock including a workpiece holding mechanism capable of holding a plurality of workpieces being aligned at different heights in a direction perpendicular to an installation plane on which the load lock is installed inside the load lock and means for changing a pressure inside of the load lock between atmospheric pressure and vacuum pressure;
   a plurality of vacuum transport chambers, each connected to the load lock, each of the plurality of the vacuum transport chambers being respectively connected to a corresponding one of the plurality of the process chambers, wherein each of the plurality of vacuum transport chambers and each of the process chambers connected thereto constitutes a plurality of pairs and each of the vacuum transport chambers includes a plurality of vacuum transfer robots, installed in each of the vacuum transport chambers, for transferring the workpieces between the vacuum transport chambers and the load lock and between the vacuum transport chambers and the corresponding process chambers;
   a housing, disposed in front of and connected to the load lock, including an atmospheric-transfer robot for transferring the workpieces between the housing and the load lock;
   load lock valves configured to open and close at connecting portions between each of the plurality of vacuum transport chambers and the load lock, each of the plurality of vacuum transport chambers being connected to the load lock via the load lock valves;
   process chamber valves configured to open and close at connecting portions between each of the plurality of vacuum transport chambers and the corresponding one of the process chambers; and
   control means for controlling timing of the opening and closing actions of the load lock valves and of the process chamber valves and for controlling the plurality of the vacuum transfer robots in each of the vacuum transport chambers and the atmospheric transfer robot in the housing;
   wherein each of the plurality of the workpieces in the workpiece holding mechanism are transferred into the inside of the load lock and placed on different heights by the plurality of vacuum transfer robots with an extended arm,
   wherein the control means is configured to open a plurality of the load lock valves concurrently, and to control the plurality of vacuum transfer robots disposed in each of the vacuum transport chambers so that two of the plurality of vacuum transfer robots in different ones of the vacuum transport chambers can concurrently access the workpiece holding mechanism in the load lock and concurrently transport at least two of the workpieces in the load lock to different ones of the vacuum transport chambers,
   wherein, in a state where all the load lock valves are closed by the control means, the control means is configured to allow each of the process chamber valves to perform the opening and closing actions independently of others of the process chamber valves, and
   wherein the control means is configured to control the plurality of vacuum transfer robots to concurrently transfer a plurality of the workpieces to the vacuum process chambers respectively in a state where the control means opens a plurality of the process chamber valves concurrently.

2. The vacuum processing apparatus according to claim 1, wherein the plurality of workpieces held by the holding mechanism are each transferred from the load lock via one or more of the plurality of vacuum transport chambers to each of the process chambers in a period of time where the load lock is maintained in a vacuum state.

3. The vacuum processing apparatus according to claim 2, further comprising:
   another load lock valve disposed and configured to open and close between the load lock and the housing, the another load lock valve being disposed in a position having a height difference from the load lock valves; and
   conveying means disposed in the load lock for conveying the workpiece carried in the load lock via the another load lock valve to a position in the load lock via one of the load lock valves to a position at the height of the another load lock valve.

4. The vacuum processing apparatus according to claim 2, wherein the control means is configured to control the each of the plurality of vacuum transfer robots to transfer the workpiece to be processed from the load lock to the one of the process chambers along each of paths which includes the load lock and the one of the process chambers and the each of the vacuum transfer chamber, and then, after the process in the one of the process chambers is finished, transfer the workpiece back to the load lock along the path which the processed workpiece was previously transferred.

5. The vacuum processing apparatus according to claim 1, further comprising:
   another load lock valve disposed and configured to open and close between the load lock and the housing, the another lock valve being disposed in a position having a height different from the load lock valves; and
   conveying means disposed in the load lock for conveying the workpiece carried in the load lock via the another load lock valve to a position in the load lock via one of the load lock valves to a position at the height of the another load lock valve.

6. The vacuum processing apparatus according to claim 1, wherein the control means is configured to control the each of the plurality of vacuum transfer robots to transfer the workpiece to be processed from the load lock to the one of the process chamber along each of paths which includes the load lock and the one of the process chambers and the each of the vacuum transfer chambers, and then, after the process is finished, transfer the workpiece back to the load lock along the path which the processed workpiece was previously transferred.

* * * * *